(12) United States Patent
Jiang

(10) Patent No.: US 8,797,131 B2
(45) Date of Patent: *Aug. 5, 2014

(54) THERMAL SHIELD AND METHOD FOR THERMALLY COOLING A MAGNETIC RESONANCE IMAGING SYSTEM

(75) Inventor: Longzhi Jiang, Florence, SC (US)

(73) Assignee: General Electric Company, Schenectady, NY (US)

( * ) Notice: Subject to any disclaimer, the term of this patent is extended or adjusted under 35 U.S.C. 154(b) by 704 days.

This patent is subject to a terminal disclaimer.

(21) Appl. No.: 12/783,413

(22) Filed: May 19, 2010

(65) Prior Publication Data

US 2011/0284191 A1 Nov. 24, 2011

(51) Int. Cl.
*H01F 1/00* (2006.01)
*H01F 6/00* (2006.01)

(52) U.S. Cl.
USPC .......................................... 335/216; 335/296

(58) Field of Classification Search
USPC ........... 335/216, 296–299, 302–306; 361/192
See application file for complete search history.

(56) References Cited

U.S. PATENT DOCUMENTS

| | | | |
|---|---|---|---|
| 5,651,256 A * | 7/1997 | Herd et al. | 62/51.1 |
| 6,246,308 B1 | 6/2001 | Laskaris et al. | |
| 7,003,963 B2 | 2/2006 | Alford | |
| 7,170,377 B2 | 1/2007 | Jiang et al. | |
| 7,515,973 B2 | 4/2009 | Chan | |
| 2006/0022779 A1* | 2/2006 | Jiang et al. | 335/216 |
| 2006/0082370 A1* | 4/2006 | Cirel | 324/318 |
| 2009/0256663 A1* | 10/2009 | Hsieh et al. | 335/216 |
| 2011/0271693 A1* | 11/2011 | Jiang et al. | 62/47.1 |
| 2012/0028805 A1* | 2/2012 | Hollis et al. | 505/162 |
| 2012/0081117 A1* | 4/2012 | Jiang et al. | 324/318 |

FOREIGN PATENT DOCUMENTS

| | | |
|---|---|---|
| GB | 2292597 A | 2/1996 |
| JP | 60155100 A | 8/1985 |
| JP | 2000353614 A | 12/2000 |

OTHER PUBLICATIONS

Search Report from corresponding GB Application No. GB1107894.6 dated Sep. 5, 2011.

* cited by examiner

*Primary Examiner* — Bernard Rojas
(74) *Attorney, Agent, or Firm* — The Small Patent Law Group; Dean D. Small

(57) ABSTRACT

A thermal shield and method for thermally cooling a magnetic resonance imaging (MRI) system are provided. One thermal shield includes a cooling tube forming a frame. The cooling tube is configured to receive therethrough cryogen fluid from a cryogen vessel of an MRI system. The thermal shield further includes at least one thermal control layer surrounding the frame and together with the frame is configured to provide thermal shielding of the MRI system.

20 Claims, 5 Drawing Sheets

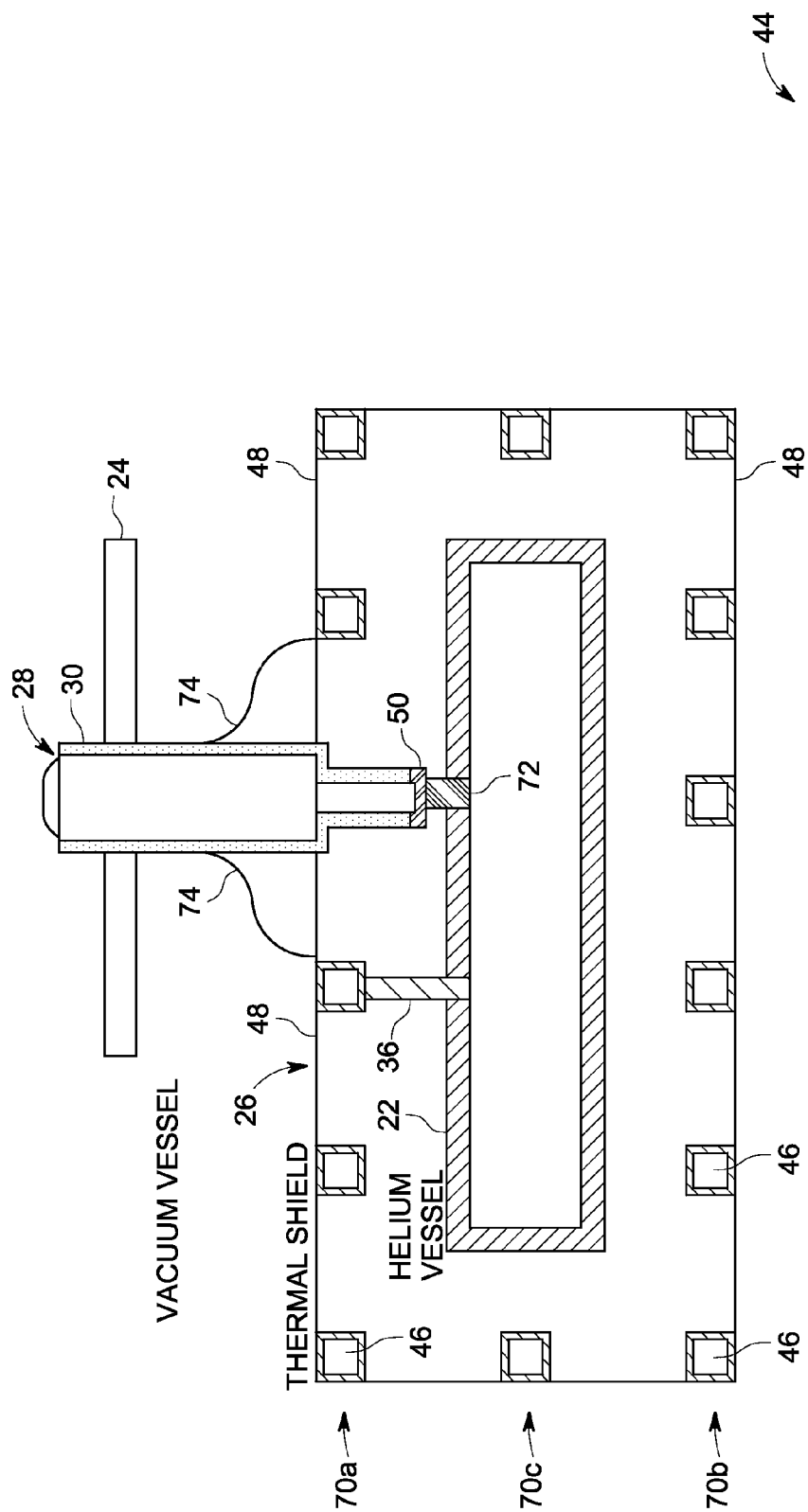
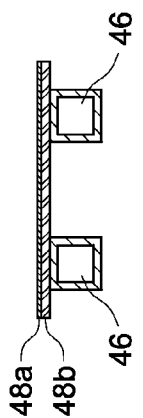

THERMAL SHIELD AND METHOD FOR THERMALLY COOLING A MAGNETIC RESONANCE IMAGING SYSTEM

BACKGROUND OF THE INVENTION

The subject matter disclosed herein relates generally to cryogenically cooled magnetic resonance imaging (MRI) systems, and more particularly to systems and methods for providing a thermal shield for the MRI systems.

In superconducting coil MRI systems, the coils forming the superconducting magnets are cryogenically cooled using a helium vessel. The cryogen cooling system of some of these MRI systems include a coldhead within a coldhead sleeve that operates to recondense vaporized cryogen to continually cool the superconducting magnet coils during system operation. Additionally, a thermal shield may be provided, which is typically positioned within the vacuum vessel between vacuum vessel and the helium vessel.

Conventional thermal shields have to be formed as thick metal structures from a high thermal conducting material, such as aluminum, to provide the necessary thermal conduction. However, the thickness of these structures not only have a higher mass, but require longer time periods to cool down, as well as being electrically conducting. Additionally, the structures have higher vibration induced field instability due to high conductance.

Also, when the coldhead is off, for example, during transportation of the MRI system, power off of the MRI system during normal operation, or coldhead failure, the coldhead sleeve is heated due to contact between the coldhead and the coldhead sleeve. During this time, the coldhead sleeve acts like a heat sink (or heat source) and applies heat to the MRI system, including to a thermal shield and the helium vessel of the MRI system. In this condition with the coldhead sleeve acting like a heat sink and heating up the thermal shield and helium vessel, helium inside the helium vessel boils off. Thus, helium from the helium vessel is lost and must be replaced, which results in added cost and system maintenance as there is no path for cooling of the thermal shield.

Moreover, making the structures thinner would not provide the needed thermal conduction. Accordingly, higher temperature gradients and a greater likelihood of cracking or breaking of the structure would result.

BRIEF DESCRIPTION OF THE INVENTION

In accordance with various embodiments, a thermal shield for a magnetic resonance imaging (MRI) system is provided that includes a cooling tube forming a frame. The cooling tube is configured to receive therethrough cryogen fluid from a cryogen vessel of an MRI system. The thermal shield further includes at least one thermal control layer surrounding the frame and together with the frame is configured to provide thermal shielding of the MRI system.

In accordance with other embodiments, a magnet system for a magnetic resonance imaging (MRI) device is provided that includes a vacuum vessel, a cryogen vessel having liquid helium therein, wherein the cryogen vessel is within the vacuum vessel. The magnet system further includes a superconducting magnet within the cryogen vessel and a coldhead sleeve configured to receive a coldhead for cooling the superconducting magnet. The coldhead sleeve is coupled to the vacuum vessel. The magnet system also includes a thermal shield within the vacuum vessel and having the helium vessel therein. The thermal shield includes a frame formed from a cooling tube and is surrounded by a thermal control layer, wherein the cooling tube is connected to the cryogen vessel.

In accordance with yet other embodiments, a method of manufacturing a thermal shield for a magnet resonance imaging (MRI) system is provided. The method includes forming a frame from a cooling tube, wherein the cooling tube is configured to receive therethrough cryogen fluid from a cryogen vessel of an MRI system. The method further includes coupling at least one thermal control layer around the frame, which together with the frame is configured to provide thermal shielding of the MRI system.

BRIEF DESCRIPTION OF THE DRAWINGS

FIG. 3 is a diagram illustrating a thermal shield formed from a cooling tube in accordance with various embodiments.

FIG. 4 is a simplified diagram of a thermal control layer formed in accordance with various embodiments.

DETAILED DESCRIPTION OF THE INVENTION

Figure 1:
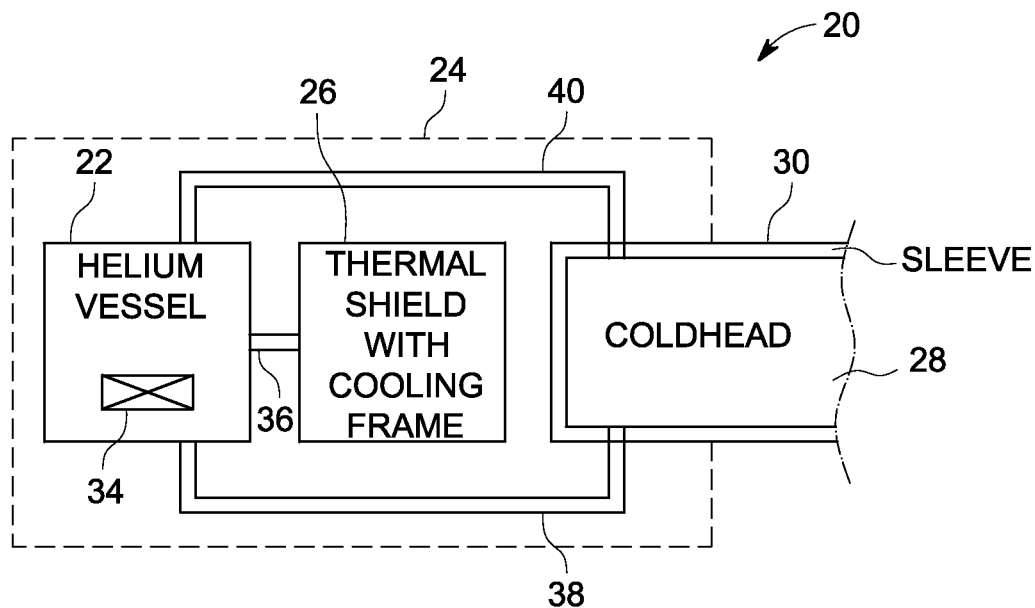
FIG. 1 is a simplified block diagram of magnetic resonance imaging (MRI) magnet system illustrating a thermal shield arrangement formed in accordance with an embodiment.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments include systems and methods for providing a thermal shield for a magnetic resonance imaging (MRI) system. In some embodiments, a frame structure is surrounded by a thermal control layer or skin that provides a conduction path and radiation control. The frame structure may be formed from one or more cooling tubes allowing cryogen to flow therethrough. By practicing at least one embodiment, cooling of a magnet system is provided with a coldhead in connection with a thermal shield that has a lower thermal mass, less field instability and may result in less welding time during manufacture. Moreover, a path for exhaust gas to pass through is provided during cool down, transportation and power off conditions of the coldhead. Additionally, by practicing at least one embodiment, reduced cryogen consumption can result. Thus, in accordance with various embodiments, the cooling tube(s) form the main frame of the thermal shield and provides the stiffness for the thermal shield. Accordingly, the control layer may be made thin or very thin in accordance with various embodiments as described in more detail herein.

FIG. 1 is a simplified block diagram of a cooling arrangement having a thermal shield formed in accordance with various embodiments. More particularly, FIG. 1 illustrates an MRI magnet system 20, which includes one or more superconducting magnets. The MRI magnet system 20 includes a vessel 22 that holds a liquid cryogen, such as liquid helium. Thus, in this embodiment, the vessel 22 is a helium vessel, which also may be referred to as a helium pressure vessel. The vessel 22 is surrounded by a vacuum vessel 24 and includes a thermal shield 26 therein and/or therebetween. The thermal shield 26 may be, for example, a thermally isolating radiation shield and include a cooling frame, and in particular, a frame structure that allows cryogen to flow therethrough as described in more detail herein.

A coldhead 28, which in various embodiments is a cryocooler, extends through the vacuum vessel 24 within a coldhead sleeve 30 (e.g., a housing). Thus, the cold end of the coldhead 28 may be positioned within the coldhead sleeve 30 without affecting the vacuum within the vacuum vessel 24. The coldhead 28 is inserted and secured within the coldhead sleeve 30 using any suitable means, such as one or more flanges and bolts, or other means known in the art. Moreover, a motor 42 (shown in FIG. 2) of the coldhead 28 is provided outside the vacuum vessel 24.

Figure 2:
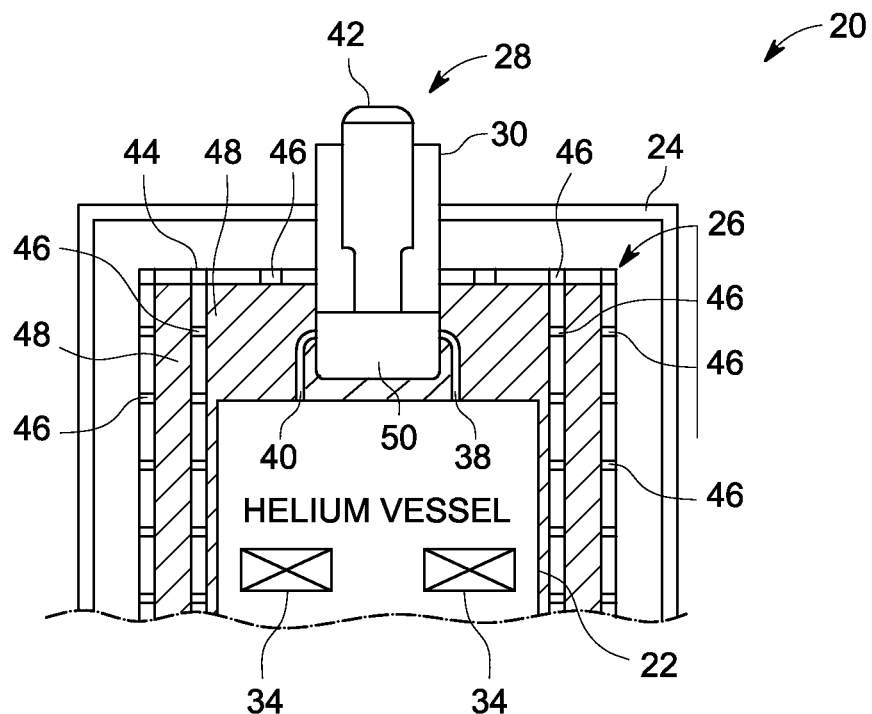
FIG. 2 is a cross-sectional view of a magnetic resonance imaging (MRI) magnet system illustrating a cooling tube of a thermal shield formed in accordance with various embodiments.

One or more magnets 34 (one magnet 34 is illustrated in FIG. 1 and two magnets 34 are illustrated in FIG. 2), which in various embodiments is a superconducting magnet, is provided inside the helium vessel 22 and is controlled during operation of the MRI system as described in more detail herein to acquire MRI image data. Additionally, during operation of the MRI system, liquid helium within the helium vessel 22 of the MRI magnet system 20 cools the superconducting magnet 34, which may be configured as a coil assembly as is known. The superconducting magnet 34 may be cooled to a superconducting temperature, for example, 4.2 Kelvin (K). The cooling process may include the recondensing of boiled off helium gas to liquid by a helium recondensing system (not shown in FIG. 1) and returned to the helium vessel 22. It should be noted that the boiled off helium may pass through a gas passageway 36 that connects the helium vessel 22 to the thermal shield 26, and which may form part of the thermal shield 26, for example, such as cooling tubes, as described in more detail below. The passage of the helium gas from the gas passageway 36 through the cooling frame of the thermal shield 26 acts to cool the thermal shield 26. The cooling system also includes gas passageways 38 and 40 (e.g., tubes) that connect the helium vessel 22 to the coldhead 28 to cool the cryogen.

In various embodiments, for example as illustrated in FIGS. 1 and 2, the gas passageway 38 and gas passageway 40, respectively, operate to transfer or communicate helium gas from the helium vessel 22 to circulate boiled off helium gas to and from the coldhead 28. Additionally, the passageway 36 operates to transfer or communicate helium gas from the helium vessel 22 to circulate helium gas (e.g., boiled off helium gas) from the helium vessel 22 in or at the thermal shield 26, for example, during normal operation or during a power off condition of the coldhead 28. It should be noted that any coupling arrangement or means for transferring the helium to and from the helium vessel 22 may be used.

FIG. 2 is a cross-sectional view of a portion of the MRI magnet system 20 illustrating a cooling frame structure formed in accordance with various embodiments. It should be noted that like numerals represent like or similar parts in FIGS. 1 and 2. As shown, the helium vessel 22 is surrounded by the vacuum vessel 24 and includes the thermal shield 26 therein and/or therebetween, which thermal shield may be, for example, a thermally isolating radiation shield having a frame 44.

The coldhead 28, which in various embodiments is a cryocooler, extends through the vacuum vessel 24 within the coldhead sleeve 30 (e.g., a housing) with the motor 42 of the coldhead 28 provided outside the vacuum vessel 24. During operation of the MRI system, liquid helium within the helium vessel 22 of the MRI magnet system 20 cools the superconducting magnets 34, which may be configured as a coil assembly as is known. The cooling process may include the recondensing of boiled off helium gas to liquid by a helium recondensing system 50 and returned to the helium vessel 22. It should be noted that the boiled off helium may pass through the gas passageway 38 that connects the helium vessel 22 to a recondensing system 50 and the recondensed helium may be returned to the helium vessel through the passageway 40.

The frame 44 also is connected to the helium vessel 22 such that cryogen within the helium vessel 22 can circulate through passageways, illustrated as tubes 46 (which may be a single tube) that form the structure of the frame 44. Accordingly, the tubes 46 operate to cool the thermal shield 26, which is formed from the frame 44 and one or more thermal control layers 48 surrounding the frame 44. Thus, the frame 44 is surrounded by a thermal control layer or skin, such as the one or more layers 48 and that provide a conduction path and radiation control. The frame 44 in this embodiment generally defines a hollow wall structure with the tube(s) 46 circumferentially surrounding the helium vessel 22. However, it should be noted that the frame 44 may be configured such that the cooling passageways, such as the tube(s) 46, are positioned, oriented or extend in different directions or alignments. For example, as described in more detail herein, the tube(s) 46 may extend axially instead of circumferentially.

The tube(s) 46 may be configured as cooling tubes that have any shaped cross-section. For example, the tube(s) 46 may have a substantially circular (or circular), flatted circle (two planar sides), substantially square (or square), substantially rectangular (or rectangular), substantially oval (or oval) or other cross-sectional shape. Thus, the tube(s) 46 may be, for example, cylindrical, provided as flanges, etc. The shape and configuration of the tube(s) 46 may be provided such that thermal contact with the one or more layers 48 is increased. The tube(s) 46 also may have any cross-sectional size (i.e., across the diameter of the cooling tube 40). The diameter of the tube(s) 46 may be selected to maximize or increase the thermal contact between the tube(s) 46 and the one or more layers 48.

The tube(s) 46 also may be formed from different materials and/or tubing. For example, in some embodiments, the tube(s) 46 are formed from a metal material, such as copper or aluminum. In general, the tube(s) 46 are formed from a high thermal conductivity material.

In one embodiment, as illustrated in FIG. 3, the thermal shield 26 is formed from the frame 44 and the layer(s) 48 surrounding the frame 44. More particularly, the frame 44 is formed from the tube(s) 46 such that the arrangement of the tube(s) 46 defines the shape and structure of the frame 44. For example, the tube(s) 46 may define a spiral arrangement configured to extend circumferentially around the helium vessel 22 and is contained within the vacuum vessel 24. It should be noted that the frame 44 may be formed from a single tube 46 or a plurality of interconnected tubes 46 or tube sections. In some embodiments, a single circumferential arrangement is provided. In other embodiments, the frame 44 is formed from a plurality of concentrically aligned circumferentially extending tubes 46, such that one spiral length of tube 46 is positioned radially inward or outward of another length of tube 46. As discussed in more detail below, in the illustrated embodiment, two lengths 70a and 70b of tubes 46 are concentrically aligned axially along and defining the entire length of the frame 44 (e.g., to define a hollow wall structure when surrounded by the layer(s) 48) with a third length 70c of tube 46 positioned at each end of the frame 44. It should be noted that each length 70 of tube 46 may be separate or interconnected.

The one or more tubes 46, which may be separate lengths 70 or interconnected, are connected to the helium vessel 22, for example, by the passageway 36. The recondensor 50 is also coupled to the helium vessel 22 via one or more passageways 72, which may be formed by the passageways 38 and 40 (shown in FIG. 2). For example, one passageway may be provided from the helium vessel 22 to the recondensor 50 for transferring boiled off helium gas and another passageway may be provided from the recondensor 50 to the helium vessel 22 for transferring back recondensed helium liquid.

It should be noted that one or more thermal links 74 between the coldhead sleeve 30 and the thermal shield 26 is represented by a pair of lines connecting the coldhead sleeve 30 and thermal shield 26. The thermal link(s) 74 merely illustrate that thermal conduction exists between the thermal shield 26 and the coldhead sleeve 30.

The tube(s) 46 forming the frame 44 in various embodiments have a stiffness or rigidity such that the layer(s) 48, when coupled thereto, define walls or a housing of the thermal shield 26. Thus, the frame 44 is self-supporting and includes one or more layer(s) 48, which as illustrated in FIG. 4 are thermal layers or thermal control layers. For example, two layers 48a and 48b are illustrated with the layer 48a coupled to the layer 48b, which is coupled to the frame 44, and more particularly, to one or more tubes 46 forming the frame 44 (a portion of which is shown in FIG. 4). It should be noted that the layers 48 may be one or more separate pieces of material that surround the frame 44 to define the thermal shield 26.

In some embodiments, the layer 48a is an emissivity control layer and formed, for example, from an aluminum foil tape, such as a polyester film-laminated aluminum foil with conductive acrylic adhesive. The layer 48b in some embodiments is formed, for example, from a mesh material having a high thermal conductance, such as a copper mesh. Thus, the layers 48 together form an outer covering for the frame 44, which in some embodiments includes the layer 48b epoxied to one or more tubes 46 with the layer 48a taped to the layer 48b. Accordingly, a multi-layer cover is formed surrounding the frame 44. It should be noted that the layer(s) 48 may be coupled to both an outside portion and an inside portion of the frame 44 as described in more detail below. Additionally, the layers 48 may be of the same or different thickness. For example, in one embodiment, each of the layers 48a and 48b may be about one half of a millimeter or one millimeter thick.

Figure 5:
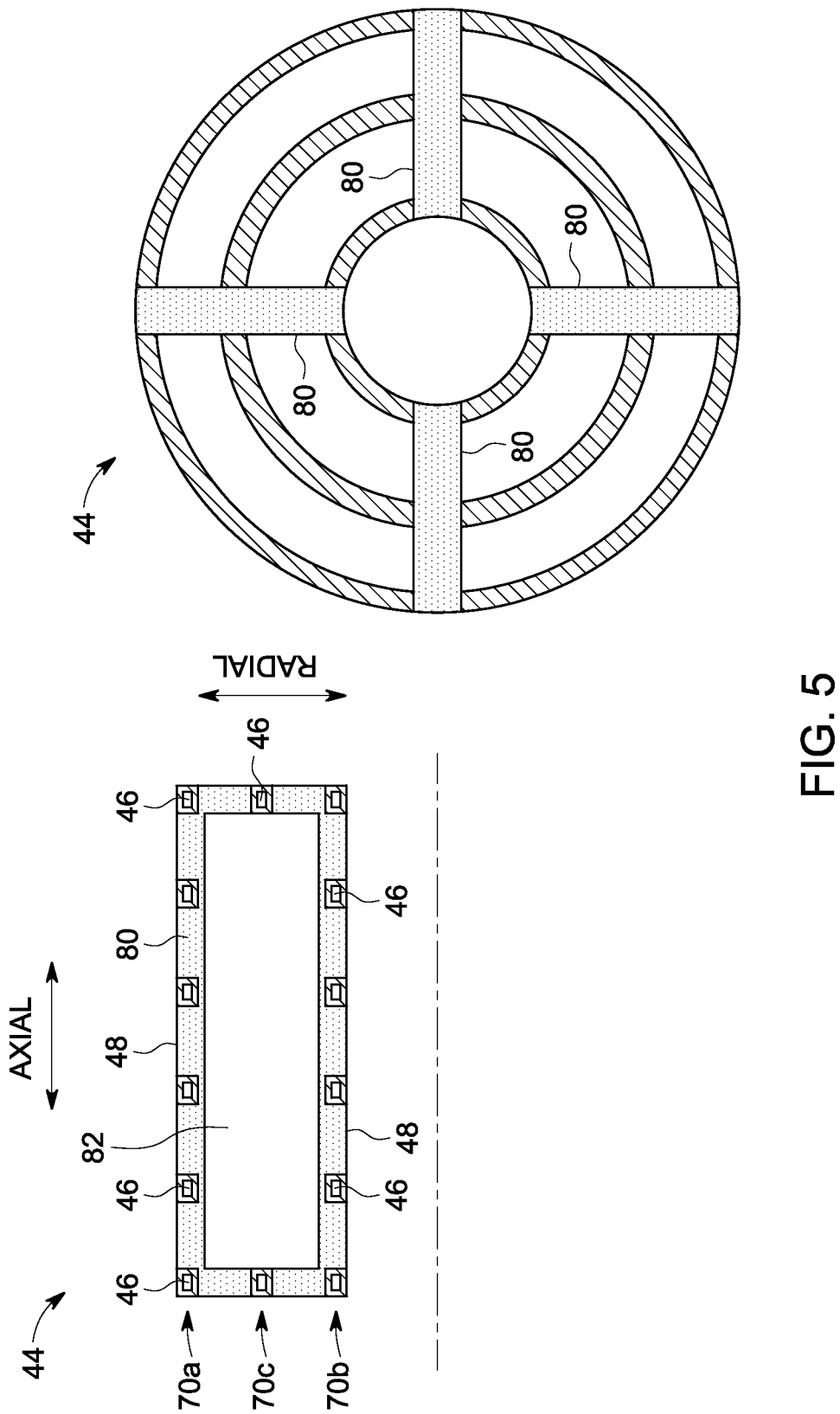
FIG. 5 is a diagram illustrating a frame for a thermal shield formed from a cooling tube in accordance with various embodiments.

In some embodiments, additional support elements 80 may be provided in connection with the frame 44 as illustrated in FIG. 5. For example, a plurality of support elements 80, which may be support ribs or additional frame structure, extend radially outward, such as between the various lengths 70 of the tube(s) 46 along ends of the frame 44 and optionally at different axial positions along the frame 44. Optionally, the support elements may extend axially. Thus, as illustrated in FIG. 5, three concentrically aligned arrangements of tubes 46 are provided at each end of the frame 44 with an outer and inner length 70a and 70b extending circumferentially around a plurality of axial positions (e.g., in a spiral arrangement) to thereby define a wall structure for the frame 44 and having a gap 82 therein.

Figure 6:
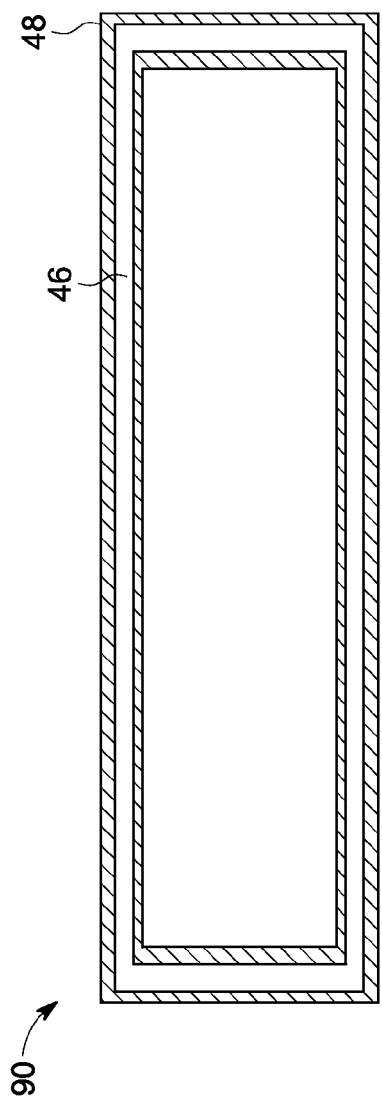
FIG. 6 is a diagram illustrating a frame for a thermal shield formed from a cooling tube in accordance with other various embodiments.

It should be noted that other configurations or arrangements are contemplated, such as different tube windings or lengths that define the structure of the frame 44. For example, as illustrated in FIG. 6, the tubes 46 may be provided in the (2D) two-dimensional plane of the frame 44. It should be noted that additional support elements (not shown) also may be provided along the radial and/or axial direction in this and other embodiments. In some embodiments, the tube(s) 46 may be arranged spirally along the axial direction, as well as wound in the 2D plane of the frame 44.

The various embodiments provide any configuration or arrangement of tube(s) 46 that allow a frame structure to be defined (e.g., crisscross shaped tubing arrangement). Thus, the tube(s) 46 in various embodiments form the mainframe of the structure for the thermal shield 26.

Figure 8:
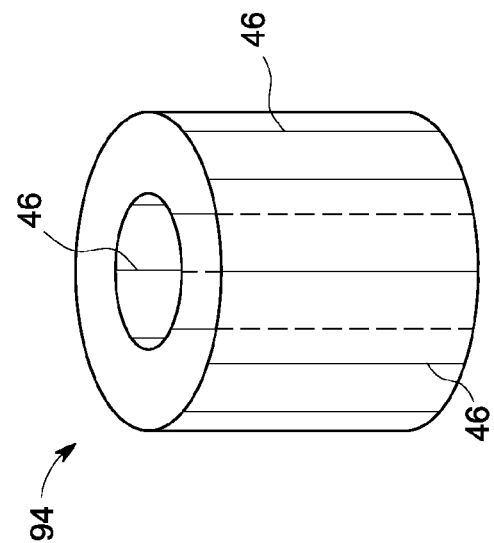
FIG. 8 is a diagrammatic illustration of a thermal shield frame formed from a cooling tube in accordance with other various embodiments.
Figure 7:
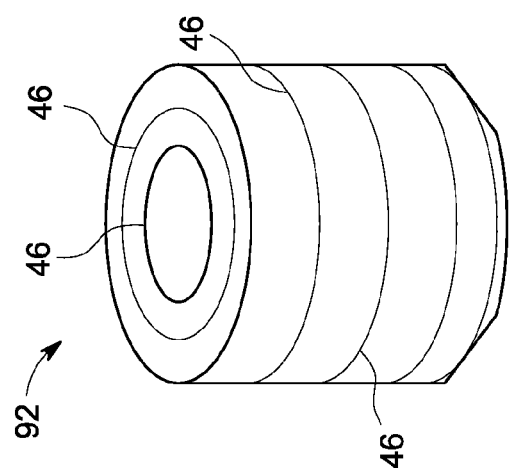
FIG. 7 is a diagrammatic illustration of a thermal shield frame formed from a cooling tube in accordance with various embodiments.

FIGS. 7 and 8, are simplified diagrammatic illustrations of exemplary frames 92 and 94, respectively, that may form part of the thermal shield 26. In both embodiments, an outer covering, for example, the layer(s) 48 surrounds the frames 92 or 94 to define a generally cylindrical structure, which may be configured to receive therein the helium vessel 22 (shown in FIGS. 1 through 3). Thus, as shown in FIG. 7, the tube(s) 46 are arranged in a circumferential configuration, which may be a spiral arrangement or individual rings. As illustrated, a plurality of concentric tube arrangements may be provided. FIG. 8 illustrates the tube(s) 46 arranged in an axial configuration, which may be loops or individual lengths of tube 46. When the exemplary frames 92 or 94, or any frame structure formed in accordance with various embodiments is provided, is covered by the layer(s) 48, a thermal shield 26 is formed, which may define a cylindrical wall structure or other shaped structure.

Thus, a thermal shield is formed from a tube arrangement allowing cooling fluid or cryogen to flow therethrough. The tube arrangement defines the frame for the thermal shield and having a thin or thinner outer layer.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices. Moreover, the various embodiments may be implemented in connection with other types of MRI systems.

Thus, the various embodiments may be implemented in connection with thermal shields for different types of MRI systems. For example, the various embodiments may be implemented with the MRI system 100 shown in FIG. 9. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, such as of a human. Moreover, the various embodiments are not limited to medical imaging systems for imaging human subjects, but may include veterinary or non-medical systems for imaging non-human objects, luggage, etc.

Figure 9:
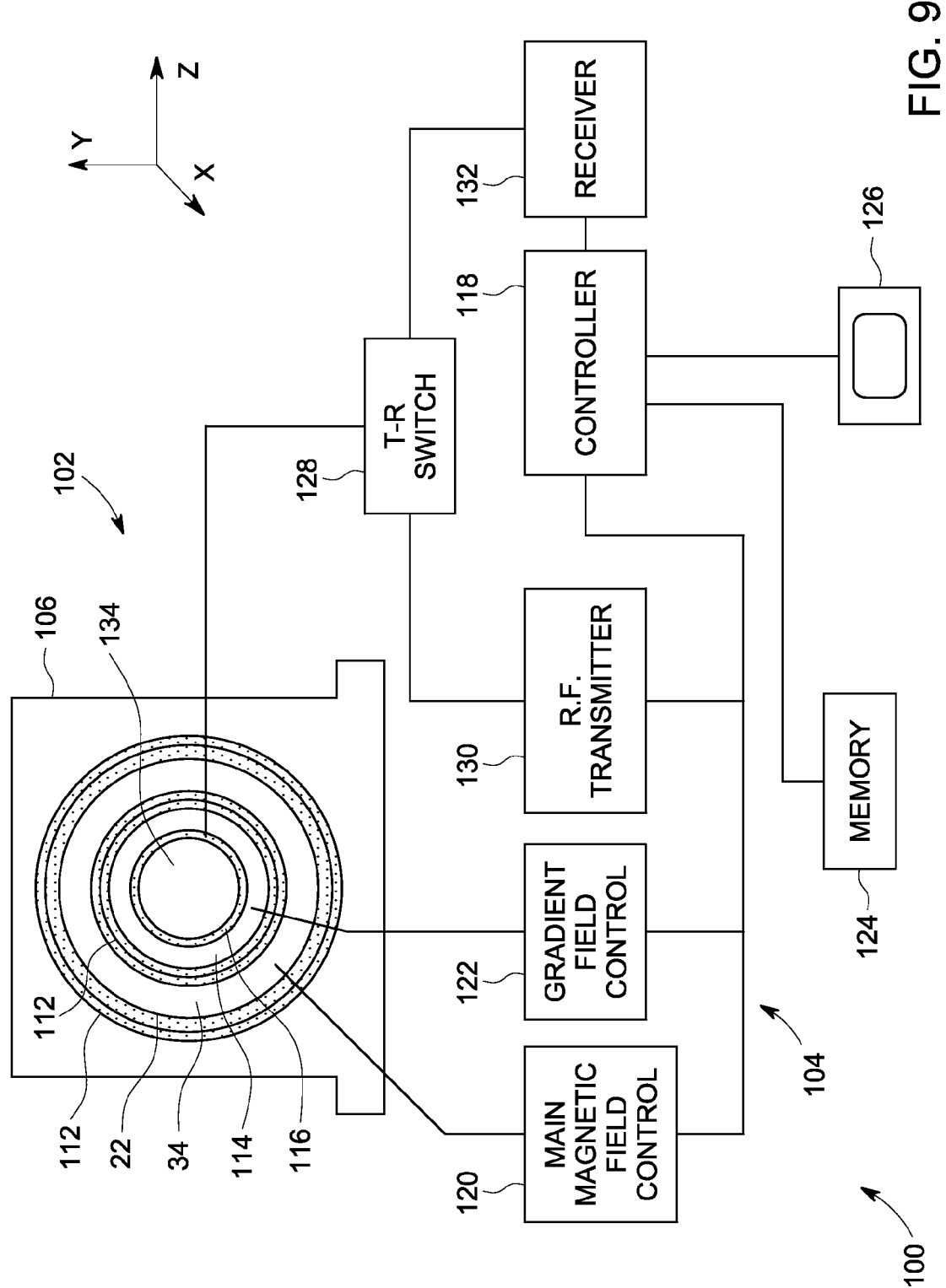
FIG. 9 is a pictorial view of an MRI system in which a thermal shield formed in accordance with various embodiments may be implemented.

Referring to FIG. 9, the MRI system 100 generally includes an imaging portion 102 and a processing portion 104 that may include a processor or other computing or controller device. The MRI system 100 includes within a gantry 106 a superconducting magnet 34 formed from coils, which may be supported on a magnet coil support structure. The helium vessel 22 (also referred to as a cryostat) surrounds the superconducting magnet 34 and is filled with liquid helium. The liquid helium may be used to cool a coldhead sleeve and/or a thermal shield as described in more detail herein.

Thermal insulation 112 is provided surrounding the outer surface of the helium vessel 22 and the inner surface of the superconducting magnet 34. A plurality of magnetic gradient coils 114 are provided inside the superconducting magnet 34 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 34 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 34 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 34.

The magnetic gradient coils 114, which include one or more gradient coil elements, are provided so that a magnetic gradient can be imposed on the magnetic field $B_o$ in the bore 134 within the superconducting magnet 34 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A thermal shield for a magnetic resonance imaging (MRI) system, the thermal shield comprising:

a cooling tube forming a frame, the cooling tube configured to receive therethrough cryogen fluid from a cryogen vessel of an MRI system; and at least one thermal control layer, that includes at least one of a continuous cover or a mesh surrounding the frame, the control layer together with the frame defining a wall that is configured to provide thermal shielding of the MRI system.

2. A thermal shield in accordance with claim 1, wherein the wall formed by the thermal control layer and the frame is configured to provide thermal radiation shielding.

3. A thermal shield in accordance with claim 1 wherein the cooling tube is arranged in a circumferential configuration.

4. A thermal shield in accordance with claim 3 wherein the circumferential configuration comprises a spiral tube arrangement.

5. A thermal shield in accordance with claim 3 wherein the circumferential configuration comprises a plurality of concentrically aligned cooling tubes.

6. A thermal shield in accordance with claim 1 wherein the cooling tube is arranged in an axial configuration.

7. A thermal shield in accordance with claim 1 wherein the cooling tube is arranged in an axial configuration and a circumferential configuration.

8. A thermal shield in accordance with claim 1 wherein the cooling tube comprises a plurality of interconnected tubes.

9. A thermal shield in accordance with claim 1 wherein the cooling tube defines a cylindrical frame having the wall with a gap therein.

10. A thermal shield in accordance with claim 1 wherein the thermal control layer comprises a plurality of layers coupled to the cooling tube.

11. A thermal shield in accordance with claim 1 wherein the thermal control layer comprises an emissivity control layer.

12. A thermal shield in accordance with claim 11 wherein the emissivity control layer comprises a foil tape.

13. A thermal shield in accordance with claim 1 wherein the thermal control layer comprises a thermal conduction layer.

14. A thermal shield in accordance with claim 13 wherein the thermal conduction layer comprises a conductive metal mesh.

15. A magnet system for a magnetic resonance imaging (MRI) device, the magnet system comprising:

a vacuum vessel;

a cryogen vessel having liquid helium therein, the cryogen vessel within the vacuum vessel;

a superconducting magnet within the cryogen vessel;

a coldhead sleeve configured to receive a coldhead for cooling the superconducting magnet, the coldhead sleeve coupled to the vacuum vessel; and a thermal shield within the vacuum vessel and having the helium vessel therein, the thermal shield comprising a frame formed from a cooling tube and surrounded by a thermal control layer, the cooling tube connected to the cryogen vessel.

16. A magnet system in accordance with claim 15 wherein the frame is shaped cylindrically and having a circumferentially configured cooling tube.

17. A magnet system in accordance with claim 15 wherein the frame is shaped cylindrically and having an axially configured cooling tube.

18. A magnet system in accordance with claim 15 wherein the thermal control layer comprises a plurality of layers including an emissivity control layer and a thermal conduction layer.

19. A magnet system in accordance with claim 15 wherein the thermal shield further comprises at feast one support element configured to support the cooling tube.

20. A method of manufacturing a thermal shield for a magnet resonance imaging (MRI) system, the method comprising:

forming a frame from a cooling tube, the cooling tube configured to receive therethrough cryogen fluid from a cryogen vessel of an MRI system; and coupling at least one thermal control layer, that includes at least one of a continuous cover or a mesh surrounding the frame, the control layer together with the frame defining a wall that is configured to provide thermal shielding of the MRI system.

* * * * *